United States Patent [19]

Aung

[11] Patent Number: 4,913,789
[45] Date of Patent: Apr. 3, 1990

[54] SPUTTER ETCHING AND COATING PROCESS

[76] Inventor: David K. Aung, 7 Kimbercroft Court, Scarborough, Ontario, Canada, M1S 4K7

[21] Appl. No.: 182,719

[22] Filed: Apr. 18, 1988

[51] Int. Cl.⁴ .............................................. C23C 14/34
[52] U.S. Cl. .......................... 204/192.3; 204/192.15; 204/192.32
[58] Field of Search ........... 204/192.15, 192.3, 192.32, 204/192.16, 192.35, 192.17

[56] References Cited

U.S. PATENT DOCUMENTS

| | | | |
|---|---|---|---|
| 3,676,317 | 7/1972 | Harkins, Jr. | 204/192.3 |
| 3,748,246 | 7/1973 | Goell | 204/192.2 X |
| 4,024,041 | 5/1977 | Hanazono et al. | 204/192.3 X |
| 4,113,578 | 9/1978 | Del Monte | 204/192.3 X |
| 4,183,780 | 12/1980 | McKenna et al. | 156/643 |
| 4,328,081 | 4/1982 | Fazlin | 204/192 E |
| 4,351,697 | 9/1982 | Shanefield et al. | 156/643 |
| 4,354,911 | 10/1982 | Dodd et al. | 204/192.15 X |
| 4,389,268 | 6/1983 | Oshima et al. | 156/150 |
| 4,399,014 | 8/1983 | Engle | 204/192 E |
| 4,411,733 | 12/1983 | Macklin et al. | 156/643 |
| 4,424,095 | 1/1984 | Frisch et al. | 156/629 |
| 4,437,961 | 3/1984 | Routh et al. | 204/192 EC |
| 4,444,848 | 4/1984 | Shanefield et al. | 428/624 |
| 4,460,618 | 7/1984 | Heinecke et al. | 427/39 |
| 4,473,437 | 9/1984 | Higashikawa et al. | 156/643 |
| 4,474,659 | 10/1984 | Fazlin | 204/192 R |
| 4,496,420 | 1/1985 | Frohlich et al. | 156/643 |
| 4,507,851 | 4/1985 | Joyner et al. | 204/192.3 X |
| 4,529,474 | 7/1985 | Fujiyama et al. | 156/643 |
| 4,530,750 | 7/1985 | Aisenberg et al. | 204/298 |
| 4,536,271 | 8/1985 | Collins | 204/192 E |
| 4,576,692 | 3/1986 | Fukuta et al. | 204/165 |
| 4,597,828 | 7/1986 | Tadros | 156/643 |
| 4,622,106 | 1/1986 | Kitagawa | 204/15 |
| 4,642,163 | 2/1987 | Greschner et al. | 204/192.3 X |
| 4,654,115 | 3/1987 | Egitto et al. | 156/643 |
| 4,705,592 | 11/1987 | Bahrle et al. | 156/630 |

Primary Examiner—Nam X. Nguyen
Attorney, Agent, or Firm—Ridout & Maybee

[57] ABSTRACT

A process for coating a diagram on a substrate is disclosed, wherein a metal mask is applied to a prepared substrate and subjected to vacuum etching followed by vacuum sputtering. The sputter coating is accomplished at high vacuum using a plurality of spinning magnetrons to give an even deposition of metal on the substrate as well as an acceptable rate of deposition. After the desired thickness of metal is sputtered onto the substrate, the metal mask is stripped from the substrate and the product is finished using known techniques.

6 Claims, 1 Drawing Sheet

SPUTTER ETCHING AND COATING PROCESS

The invention is a process for manufacturing circuit boards, three dimensional molded wiring boards, flexible circuit films, electrical push buttons, electrochromic devices and the like, which comprises the vacuum sputter deposition of a diagram such as a circuit diagram on a substrate. The invention eliminates a number of steps which were previously required in the manufacture of the aforementioned products, thereby enabling such manufacture to be effected at a significantly lower cost as compared to conventional methods. The invention also enables the plating of substrates made of materials heretofore thought to be not platable.

Prior processes for the manufacture of circuit boards and the like typically include the sputter deposition of a thin layer of conductive metal on the substrate followed by the application of a photoresist laminate to define a circuit pattern which is then completed by depositing a conductive layer of sufficient thickness in an electroplating step. Prior processes utilizing electroplating of copper, for example, require a large number of steps to prepare the substrate for electroplating and then to finish the electroplated product. Metal deposition by electroplating is relatively slow and involves the use of chemicals which require further processing for safe disposal.

The present invention employs the use of a metal mask defining a circuit or other pattern, which mask is attached to a cleaned and drilled substrate, and the masked substrate is subjected to vacuum etching and sputtering steps to deposit a layer of conductive metal on the substrate. The metal mask is preferably stainless steel or copper and is made using known techniques to provide a circuit pattern having acceptably fine lines. Accelerated metal sputtering of the masked substrate is achieved using a vacuum sputter chamber equipped with a plurality of spinning magnetrons which provide an even sputter coat for the substrate as well as an acceptably high rate of deposition. The sputtering step generally does not require more than about 10 minutes to achieve the desired thickness of conductive metal on the substrate.

The process of the present invention enables the production of circuit boards, three dimensional molded wiring boards, flexible circuit films, electrical push buttons electrochromic devices and the like, which in the context of the present description and claims shall be referred to as circuit devices. Examples of electrical push buttons include push buttons on an automobile instrument panel for activating electrically driven devices. Examples of electrochromic devices include electrochromic or photochromic mirrors which are electrically activated. The process utilizes cheaper materials and involves fewer steps which result in a significantly cheaper product being produced in much less time than is the case with prior processes. The invention does not use toxic chemicals requiring expensive processing for disposal. The physical deposition method of the invention permits plating of substrates which are not suitable for use in electroplating processes such as polyphenyl sulfide (PPS), glass and untreated plastics (e.g. nylon). The sputter coating process of the present invention provides a generally superior quality coating than is obtained using prior art electroplating techniques.

Accordingly, the present invention provides a process for sputter coating a diagram on a substrate, comprising applying a metal mask to a suitably prepared substrate, the mask having voids defining a diagram. Subjecting the masked substrate to a vacuum sputter etching step followed by subjecting the etched masked substrate to a high vacuum sputter coating step, the sputter coating providing a layer of conductive metal on the substrate having a thickness of at least 10 $\mu$m. The sputter coating step is conducted at a vacuum of at least $10^{-5}$ Torr utilizing a plurality of magnetic array centered spinning magnetrons. The metal mask is removed upon completion of sputtering, and the product is finished according to known finishing steps.

Figure 1:
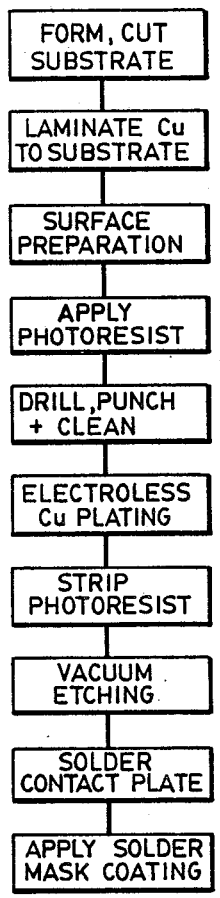
FIG. 1 is a flow chart comparing a typical prior art process to that of the present invention.
Figure 1:
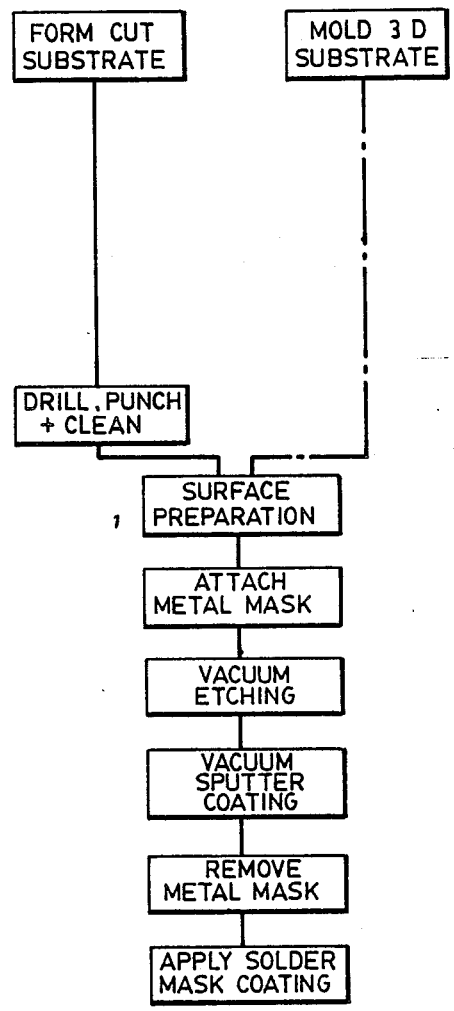

A substrate to be sputter coated in accordance with the invention is subjected to several preliminary steps, as shown in FIG. 1. Initially, the substrate is cut to the desired size and shape or, in the case of a three dimensional wiring board, is molded into the desired size and shape. In prior processes the substrate is then laminated with copper preparatory to the application of a photoresist layer. Since the present process does not require the application of a photoresist to the substrate, the cut substrate is immediately subjected to the required hole punching and drilling operations, followed by cleaning, such as ultrasonic vapour degreasing. In the case of a three dimensional substrate, the molding operation provides the required holes so that no additional drilling is needed. The three dimensional substrate can be utilized directly in the surface preparation step (see FIG. 1).

The drilled and cleaned substrate then proceeds to the surface preparation step where it is soaked in a cleaning bath, rinsed with hot water, cleaned again, preferably with an alcohol such as isopropyl alcohol, dried under a stream of hot, filtered air, and finally baked in an oven until thoroughly dry. The first three steps of the process shown in FIG. 1 are conventional and will be well known to the skilled person. These three preparatory steps involve 8 stages and require 20–45 minutes to complete.

Comparing the three initial steps of the invention to a typical prior art process shown in FIG. 1, it will be appreciated that five steps must be completed on the substrate preparatory to the plating steps. These initial five steps of the prior art process shown in FIG. 1 require 20 stages and significantly more than 45 minutes to complete.

The present invention departs markedly from prior art processes by using a metal mask to form a circuit diagram on the substrate by sputter coating. The metal mask is preferably made of copper or stainless steel which is milled to a thickness of 3–5 mil (0.003–0.005 inches) and etched to provide the desired circuit or other pattern using a laser or a chemical milling process, both of which are well known in the art. For those applications calling for particularly fine circuit lines, laser etching of the metal mask substrate is preferred. Using presently available laser techniques, pattern lines of 5–10 mil thickness within a tolerance of ±2 mil are capable of being etched in the metal masks used in the invention. The etched metal mask is mechanically attached to the prepared substrate.

The masked substrate is placed in a vacuum chamber where it is baked for up to 10 min. at preferably 200°–300° C. and then vacuum sputter etched to clean and prepare the exposed substrate portions for sputter coating. This vacuum etching step is also a standard procedure preferably conducted under $10^{-2}$ to $10^{-3}$ Torr vacuum using argon as the etching agent and using a DC or an RF biased operation. The etching step requires 1-10 min. to complete depending on the substrate.

The etched masked substrate is transferred to a vacuum sputtering chamber equipped with a plurality of magnetic array centered magnetrons having surrounding cathode targets of the desired metal for coating on the substrate. Means are provided for spinning the magnetrons preferably at a rate of from 60-120 rpm. The magnetic array and the cathode may be spun independently. The magnetrons used may be of the cylindrical type, the planar type or a mixture of the two. A sufficient number of magnetrons should be positioned within the sputtering chamber to provide a uniform and rapid deposition of metal on the masked substrate. An acceptable sputtering rate for copper according to the invention is 10,000 A-18,000 A per min., and for aluminum 6000 A-8000 A per min. Nickel and chromium may also be sputtered in accordance with the inventive process at a preferred rate of 4000 A-6000 A per min. The magnetrons may be either DC or RF powered and are cooled by water or other known means. The vacuum in the sputter chamber is at least $10^{-5}$ Torr and preferably $10^{-6}$-$10^{-7}$ Torr. Sputtering is effected by providing an inert gas such as argon to the sputter chamber at a pressure of about $10^{-3}$ Torr.

The use of an array of spinning magnetrons in the sputter chamber provides an even coating of metal and good deposition of metal in the holes of the substrate. The metal deposition rate is also increased by using spinning magnetrons as compared to stationary magnetrons. At a typical deposition rate of 1 $\mu$m/min, a satisfactory thickness of metal can be deposited on the substrate in about 12 minutes. As noted above, copper sputtering may under optimal conditions proceed at about 2 $\mu$m/min cutting the sputtering time to 5-7 min. A circuit pattern thickness of about 12 $\mu$m is about half that routinely achieved using electroplating techniques, but it has been found that for most applications of products made by the present process, a 10-12 $\mu$m thickness is sufficient. Typically, a conventional electroplating step for the deposition of 25 $\mu$m of metal on a substrate takes on the order of 1 hour.

Upon completion of the sputter coating, the substrate is removed from the sputter chamber and the metal mask is removed. The circuit device is completed by standard finishing stages such as applying a solder mask coating, baking and inspecting the product for defects. The final five steps of the inventive process shown in FIG. 1 comprise 9 stages so that the overall process shown in the flow diagram, FIG. 1, requires about 17 different stages or operations which may be completed in the order of about 1 hr. as compared to the prior art process of FIG. 1 which requires 6-8 hrs. and approximately 64 stages over the 11 steps shown.

From the foregoing it will be appreciated that the process of the invention provides a simple means for manufacturing a circuit device which utilizes inexpensive materials and requires much less time than do prior art processes. The invention does not employ electroplating and produces no toxic wastes or by-products requiring expensive treatment for disposal. While a preferred embodiment of the invention has been described, it should be understood that the invention has general application and can be varied to meet particular requirements of a given circuit device. Accordingly, the invention is more particularly defined in the following claims.

I claim:

1. A process for sputter coating a diagram onto a substrate, comprising the steps of:
   applying a high sputtering yield copper or stainless steel mask to a suitably prepared substrate, the mask having voids defining a diagram;
   vacuum sputter etching the masked substrate;
   vacuum sputter coating the etched masked substrate under high vacuum to apply a layer of an electrically conductive metal on the substrate, the layer having a thickness of at 2. A process as claimed in claim 1, wherein the metal mask is 3-5 mil thick and is provided with a diagram using laser etching.

3. A process as claimed in claim 1, wherein the metal mask is 3-5 mill thick and is provided with a diagram by chemical milling.

4. A process as claimed in claim 1, wherein the vacuum sputter etching is conducted at a vacuum of about $10^{-2}$ Torr in the presence of argon gas using a DC or RF bias means.

5. A process as claimed in claim 1, wherein the sputter coating utilizes high purity copper or aluminum cathode targets for the magnetrons.

6. A process as claimed in claim 1, further comprising the step of applying a solder mask coating to the substrate after removal of the metal mask from the sputter coated substrate.

* * * * *